US009090057B2

(12) United States Patent
Koda et al.

(10) Patent No.: US 9,090,057 B2
(45) Date of Patent: *Jul. 28, 2015

(54) PIEZOELECTRIC UNIT, LIQUID EJECTING HEAD, AND LIQUID EJECTING APPARATUS

(71) Applicant: SEIKO EPSON CORPORATION, Tokyo (JP)

(72) Inventors: Takafumi Koda, Matsumoto (JP); Isamu Togashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 17 days.

This patent is subject to a terminal disclaimer.

(21) Appl. No.: 14/095,904

(22) Filed: Dec. 3, 2013

(65) Prior Publication Data

US 2014/0085385 A1 Mar. 27, 2014

Related U.S. Application Data (63) Continuation of application No. 13/595,995, filed on Aug. 27, 2012, now Pat. No. 8,636,344.

(30) Foreign Application Priority Data

Aug. 30, 2011 (JP) .................................. 2011-186965

(51) Int. Cl.
  *B41J 2/045* (2006.01)
  *B41J 2/14* (2006.01)
  *H01L 41/047* (2006.01)

(52) U.S. Cl.
  CPC .............. *B41J 2/045* (2013.01); *B41J 2/14274* (2013.01); *H01L 41/0471* (2013.01); *H01L 41/0477* (2013.01); *B41J 2002/14491* (2013.01); *B41J 2202/11* (2013.01)

(58) Field of Classification Search
  CPC ............... B41J 2/14233; B41J 2/14201; B41J 2/14209; B41J 2/14282
  USPC .......................... 347/68, 71, 72; 310/328, 366
  See application file for complete search history.

(56) References Cited

U.S. PATENT DOCUMENTS

| 5,453,770 | A  | * | 9/1995 | Katakura et al. ................. 347/85 |
| 6,700,307 | B2 | * | 3/2004 | Kitahara ........................ 310/328 |
| 6,747,396 | B2 | * | 6/2004 | Blom ............................ 310/328 |
| 7,102,273 | B2 | * | 9/2006 | Kanaya et al. ................. 310/328 |
| 8,636,344 | B2 | * | 1/2014 | Koda et al. ...................... 347/72 |
| 2001/0017503 | A1 | * | 8/2001 | Kitahara ........................ 310/328 |
| 2012/0091859 | A1 | * | 4/2012 | Ono et al. ...................... 310/339 |

FOREIGN PATENT DOCUMENTS

| JP | 2004-327462 | 11/2004 |
| JP | 2011-056731 | 3/2011 |
| JP | 2011-071365 | 4/2011 |

* cited by examiner

*Primary Examiner* — Henok Legesse
(74) *Attorney, Agent, or Firm* — Workman Nydegger (57) ABSTRACT

In an inactive region, a farthest dummy electrode formed in a base end portion and an isolated dummy electrode island are located at positions along an extension from an individual internal electrode toward the base end portion. Such a configuration allows the area of the dummy electrode to be reduced, compared with a dummy electrode continuously formed in the inactive region. Therefore, the cost incurred by the dummy electrode is reduced, which leads to reduction in manufacturing cost of a piezoelectric unit.

9 Claims, 9 Drawing Sheets

PIEZOELECTRIC UNIT, LIQUID EJECTING HEAD, AND LIQUID EJECTING APPARATUS

CROSS REFERENCES TO RELATED APPLICATIONS

This application is a Continuation of U.S. patent application Ser. No. 13/595,995 filed Aug. 27, 2012 (which patent application is incorporated herein by reference in its entirety), which claims the benefit of Japanese Patent Application No. 2011-186965, filed Aug. 30, 2011 which is also expressly incorporated herein by reference in its entirety).

BACKGROUND

1. Technical Field

The present invention relates to a piezoelectric unit to be displaced upon applying a voltage to a piezoelectric element, and a liquid ejecting head and a liquid ejecting apparatus that include the piezoelectric unit.

2. Related Art

A liquid ejecting head has thus far been known that includes a vibration plate constituting a part of a pressure chamber communicating with a nozzle opening through which ink droplets, an example of the liquid, are dispensed, in which the vibration plate is deformed by a piezoelectric element so as to pressurize the ink in the pressure chamber to thereby dispense the ink droplets through the nozzle opening. As well, a liquid ejecting apparatus including such a liquid ejecting head is also known. Some ink jet recording heads, exemplifying the liquid ejecting head, employ a vertical vibration type piezoelectric unit that expands and contracts in an axial direction of the piezoelectric element. The vertical vibration type piezoelectric unit thus far developed include the one having a piezoelectric element block that includes a plurality of multilayer piezoelectric elements each including a common internal electrode, an individual internal electrode, and a piezoelectric material layer interposed therebetween, the piezoelectric element block being connected to a fixing substrate, for example as disclosed in JP-A-2004-327462.

The piezoelectric element block includes a distal end portion which is a free end, and a base end portion connected to the fixing substrate, and a driver wiring is connected to the base end portion. The common external electrode connected to the common internal electrode and the individual external electrode connected to the individual internal electrode are formed so as to reach the base end portion, and the driver wiring is connected to the common external electrode and the individual external electrode at the base end portion.

Normally, a silver/palladium alloy is employed as the material of the common internal electrode and the individual internal electrode, because of the sintering shrinkage that agrees with that of the piezoelectric material layer, close adhesion therewith, and high reliability (see, for example, JP-A-2011-56731 and JP-A-2011-71365).

However, the palladium, which is a rare metal, contained in the silver/palladium alloy constituting the common internal electrode and the individual internal electrode inevitably raises the manufacturing cost. Although a part of the common internal electrode or individual internal electrode located in an inactive region which is not involved in the vibration performance may be excluded for the purpose of cost reduction, in which case, however, the thickness of the base end portion in the inactive region where those electrodes are layered is changed, and therefore the connection with the driver wiring and positioning therewith by connection to the fixing substrate become difficult.

Therefore, it has been difficult to reduce the manufacturing cost of the piezoelectric unit, the liquid ejecting head, and the liquid ejecting apparatus while keeping the thickness of the base end portion of the piezoelectric element block unchanged.

SUMMARY

Accordingly, the invention may be advantageously realized as the following application examples and embodiments.

Application Example 1

A first application example represents a piezoelectric unit that includes a plurality of piezoelectric elements formed along a plurality of slits so as to extend from a first end portion of a piezoelectric element block toward a second end portion thereof, and a circuit board with a driving electrode formed on a surface thereof. The piezoelectric elements each include an active region in which a first internal electrode, a second internal electrode, a piezoelectric material layer interposed between the first internal electrode and the second internal electrode, and an insulative outer layer are stacked. The piezoelectric element block includes an inactive region in which the first internal electrode extending from the active region as far as the second end portion, a first dummy electrode formed on the second end portion at a position along an extension from the second internal electrode toward the second end portion, at least one isolated second dummy electrode formed between the second internal electrode and the first dummy electrode, the piezoelectric material layer and the outer layer are stacked, a first external electrode connected to the first internal electrode at an end face of the second end portion, and a second external electrode connected at an end face of the first end portion to the second internal electrode extending through the active region so as to reach the first end portion. The first external electrode and the second external electrode are formed so as to extend as far as a surface of the outer layer on one side of the inactive region, and the driving electrode is connected to the first external electrode and the second external electrode located in the inactive region.

In this application example, the first dummy electrode and the isolated second dummy electrode are located on the second end portion of the piezoelectric element block at the position along the extension from the second internal electrode toward the second end portion, in the inactive region. Such a configuration allows the area of the dummy electrode to be reduced, compared with the dummy electrode continuously formed in the inactive region. Therefore, the cost incurred by the dummy electrode is reduced, which leads to reduction in manufacturing cost of the piezoelectric unit.

In addition, at least one isolated second dummy electrode is provided in the inactive region between the second internal electrode and the first dummy electrode. In this case, the portion of the inactive region where the first dummy electrode and the second dummy electrode are provided can maintain the same thickness as that of the active region unlike in the case where the isolated second dummy electrode is not provided, and hence fluctuation in thickness of the piezoelectric element block in the inactive region can be suppressed. Such a configuration allows the first external electrode and the second external electrode, extending to the surface of the outer layer on the one side of the inactive region, to remain generally flat. In the piezoelectric unit thus configured, therefore, the driving electrode formed on the one surface of the circuit board can be connected along a flat surface to the first external electrode and the second external electrode.

Application Example 2

In the foregoing piezoelectric unit, the first internal electrode and the second internal electrode may contain a silver/palladium alloy.

In this case, consumption of palladium which is a rare metal can be reduced, which leads to further reduction in manufacturing cost of the piezoelectric unit.

Application Example 3

In the foregoing piezoelectric unit, the driving electrode may be connected to the first external electrode and the second external electrode through an anisotropic conductive layer. In this case, since the first external electrode and the second external electrode are generally flatly formed, the anisotropic conductive layer uniformly collapses when a pressure is imposed thereon for achieving the connection. Accordingly, contacts among the metal particles in the anisotropic conductive layer can be secured, and therefore the connection between the driving electrode formed on the one surface of the circuit board and the first external electrode and the second external electrode can be assured.

Application Example 4

In the foregoing piezoelectric unit, the first internal electrode may serve as a common internal electrode of the plurality of piezoelectric elements, and the second internal electrode may serve as an individual internal electrode of each of the plurality of piezoelectric elements.

In this application example, the first internal electrode extends from the active region to the second end portion of the piezoelectric element block, and is connected to the first external electrode at the end face of the second end portion. Such a configuration facilitates the formation of the common electrode. On the other hand, the second internal electrode extends through the active region to the first end portion of the piezoelectric element block, and is connected to the second external electrode at the end face of a distal end portion of the piezoelectric element formed along the slits extending from the first end portion toward the second end portion of the piezoelectric element block. Such a configuration facilitates the formation of the individual electrode.

Application Example 5

A fifth application example represents a liquid ejecting head that includes a nozzle plate perforated with nozzle openings through which a liquid is ejected, a flow path plate coupled with the nozzle plate and including a part of a pressure chamber communicating with the nozzle opening, and a vibration plate constituting a part of the pressure chamber. The inactive region of the piezoelectric unit is fixed to a flat fixing substrate at a predetermined position, and the first end portion is disposed in contact with the vibration plate.

In addition to the foregoing advantageous effects, since the thickness of the inactive region of the piezoelectric element block is maintained generally uniform and the surface thereof is generally flat, the inactive region can be coupled with the flat fixing substrate with high positioning accuracy and therefore the first end portion of the piezoelectric element is barely shifted from the desired contact position on the vibration plate. Consequently, the extension and contraction of the piezoelectric element can be efficiently transmitted to the vibration plate, which enables the liquid ejecting head to accurately eject a predetermined amount of liquid.

Application Example 6

A sixth application example represents a liquid ejecting apparatus that includes the foregoing liquid ejecting head.

With such a configuration, the liquid ejecting apparatus equally provides the foregoing advantageous effects.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereafter, an embodiment of will be described in details referring to the drawings. In the drawings hereafter referred to, layers and components may be illustrated in scales different from the actual ones, for the sake of better visual understanding.

Figure 1:
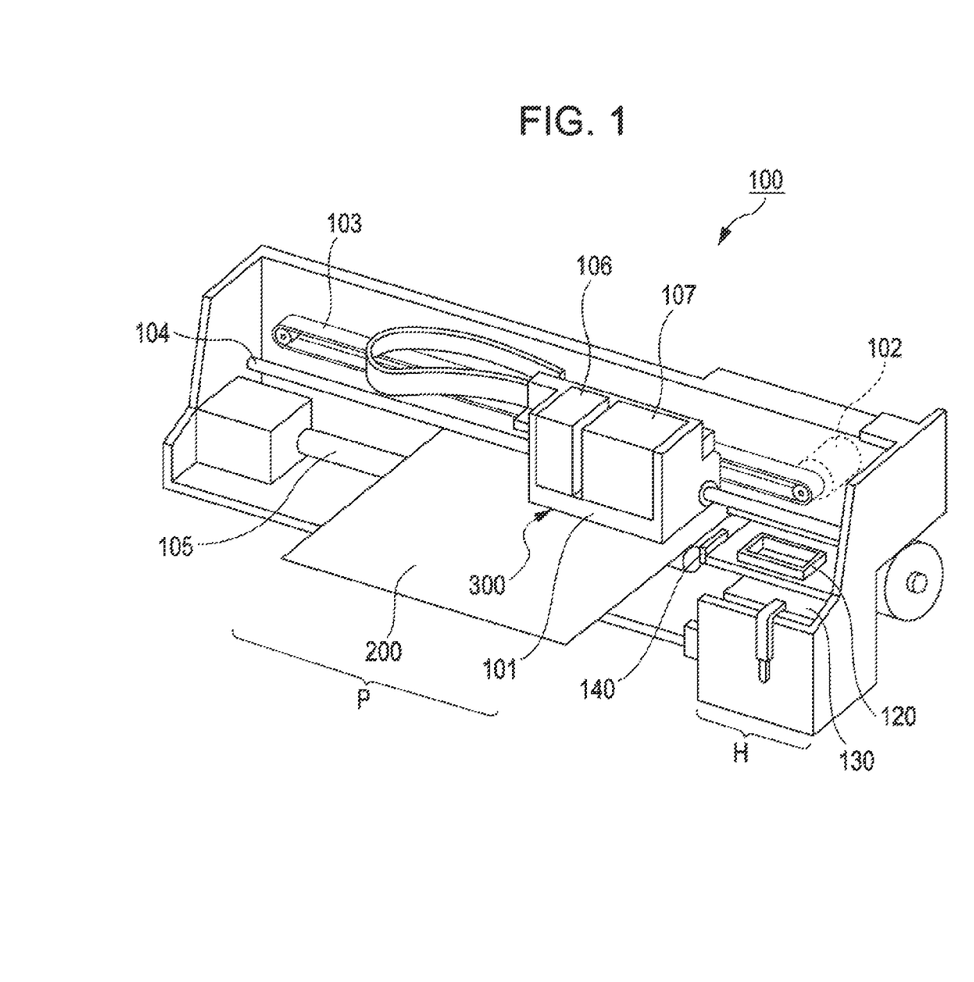
FIG. 1 is a schematic perspective view showing an ink jet recording apparatus.

FIG. 1 is a schematic perspective view showing an ink jet recording apparatus 100 according to the embodiment, exemplifying the liquid ejecting apparatus.

As shown in FIG. 1, the ink jet recording apparatus 100 includes a carriage 101. The carriage 101 is made to reciprocate in an axial direction of a platen 105 along a guide member 104, by a timing belt 103 driven by a carriage motor 102.

For example an ink jet recording head 300, an example of the liquid ejecting head to be subsequently described, is mounted on the carriage 101 at a position to oppose recording paper 200.

In addition, on the ink jet recording head 300, a black ink cartridge 106 and a color ink cartridge 107 that supply ink, which is an example of the liquid, to the ink jet recording head 300 are removably mounted.

The recording paper 200 is disposed in a printing region P, so that the ink jet recording head 300 dispenses the ink on the recording paper 200 for printing characters or images.

Further, as shown in FIG. 1, in a home position H which is a non-printing region where the recording paper 200 is not located, for example a cap 120, a suction pump 130, and a wiper 140 are located so as to constitute a cleaning unit.

Figure 2A:
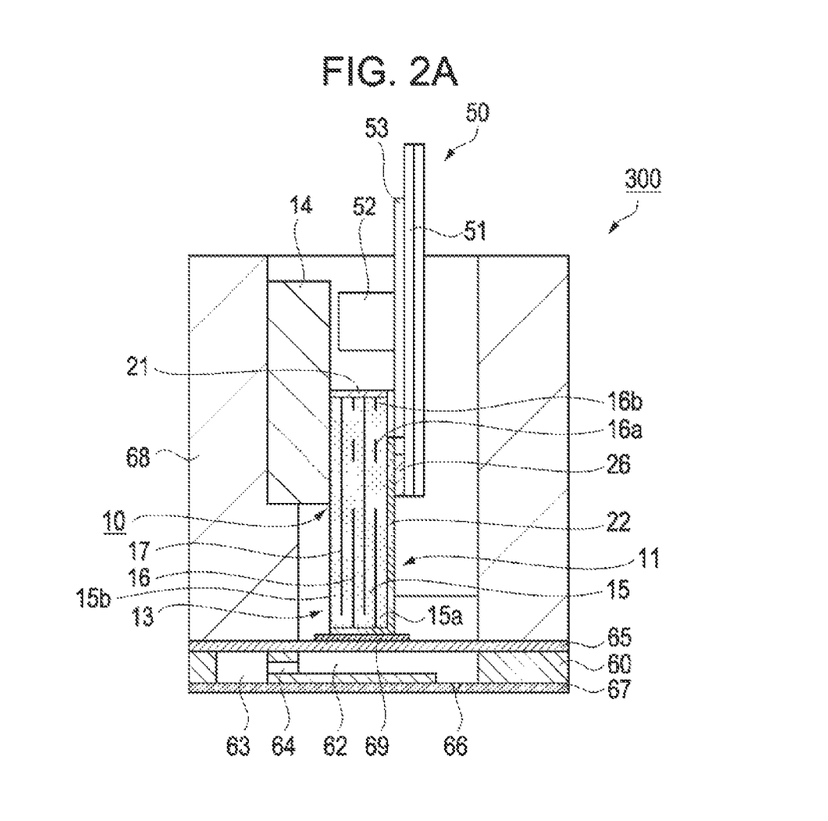
FIG. 2A is a schematic cross-sectional view of an ink jet recording head.
Figure 2B:
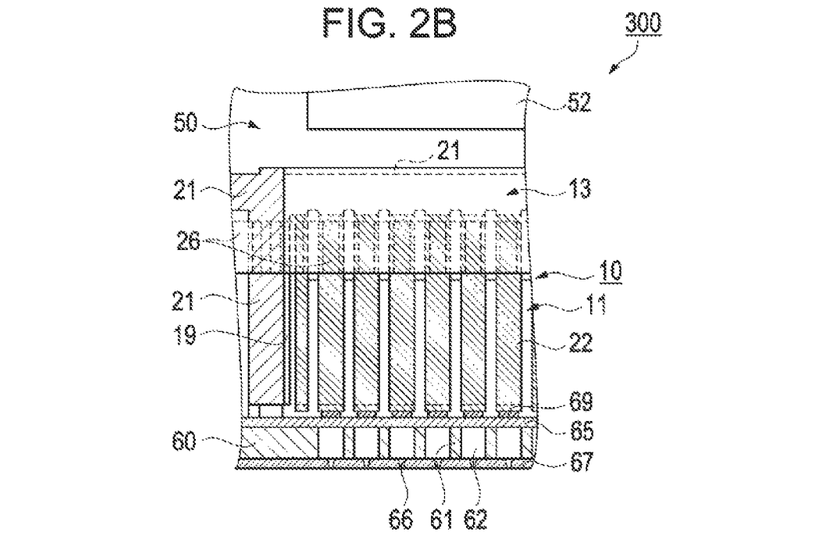
FIG. 2B is a fragmentary plan view thereof.

FIGS. 2A and 2B schematically depict the ink jet recording head 300. FIG. 2A is a schematic cross-sectional view thereof, and FIG. 2B is a fragmentary plan view thereof.

Referring to FIGS. 2A and 2B, the ink jet recording head 300 includes a piezoelectric unit 10, a flow path plate 60, a vibration plate 65, a nozzle plate 67 perforated with nozzle openings 66, and a head case 68.

The piezoelectric unit 10 includes a plurality of piezoelectric elements 11, a piezoelectric element block 13, a common external electrode 21 exemplifying the first external electrode, an individual external electrode 22 exemplifying the second external electrode, and a circuit board 50.

The circuit board 50 may be constituted, for example, of a chip on film (COF) including a driver IC 52 mounted on a driver wiring 51.

The circuit board 50 is connected to the individual external electrode 22 and the common external electrode 21, for example through electrode pads 26. The circuit board 50 also includes an insulation layer 53, except for the region where the driver wiring 51 is connected to the electrode pads 26.

The flow path plate 60 is formed of a silicon monocrystalline substrate, and pressure chambers 62 each defined by partition walls 61 are aligned in a width direction of the flow path plate 60, along one of the sides thereof. On an end portion of each pressure chamber 62 in a longitudinal direction thereof, a reservoir 63 for supplying the ink to the pressure chamber 62 is provided so as to communicating therewith through an ink outlet 64. The face of the flow path plate 60 on the side of the opening of the pressure chamber 62 is covered with the vibration plate 65, and the nozzle plate 67 perforated with the nozzle openings 66 is bonded to the opposite face of the flow path plate 60 with an adhesive, a hot-melt film, or the like.

The head case 68 having ink supply paths communicating with the black ink cartridge 106 and the color ink cartridge 107 shown in FIG. 1 is fixed to the vibration plate 65, and the piezoelectric unit 10 is fixed to the head case 68 at a position determined with high accuracy by means of fixing substrate 14 having a flat plate shape. More specifically, the piezoelectric unit 10 is positioned such that the tip portion, i.e. the distal end portion of each piezoelectric element 11 contacts one of pedestals 69 formed on the vibration plate 65 at positions corresponding to the respective pressure chambers 62. The fixing substrate 14 may be formed, for example, by punching a stainless steel plate.

The piezoelectric unit 10 will now be described in details hereunder.

Figure 3:
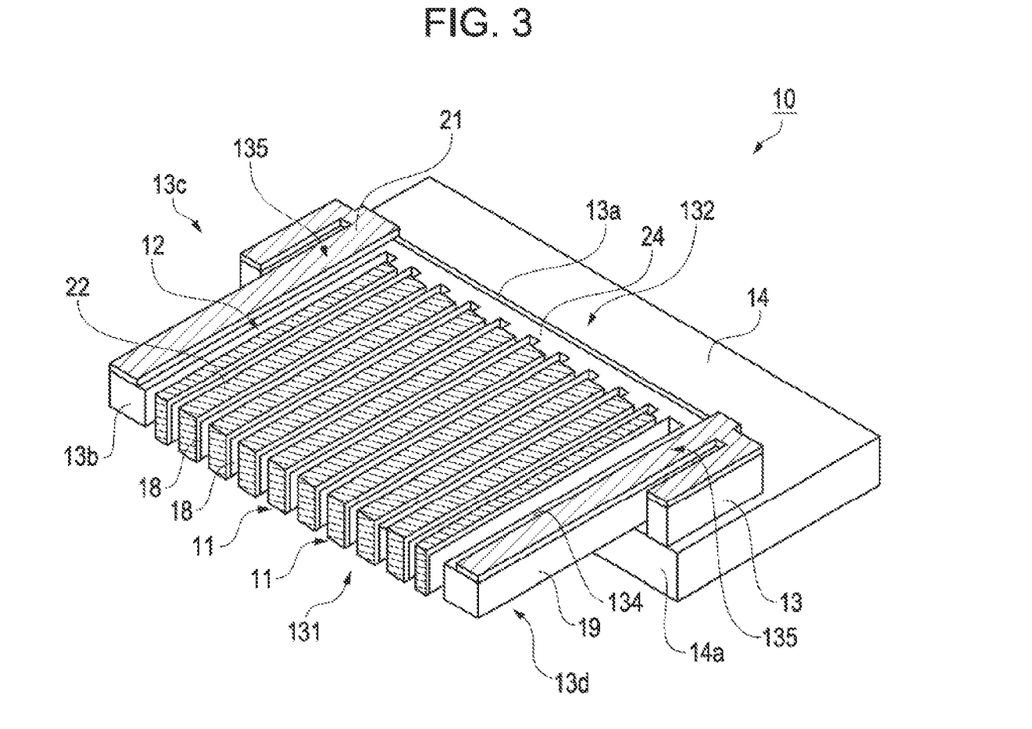
FIG. 3 is a schematic perspective view of a piezoelectric unit viewed from the side of a piezoelectric element.
Figure 4A:
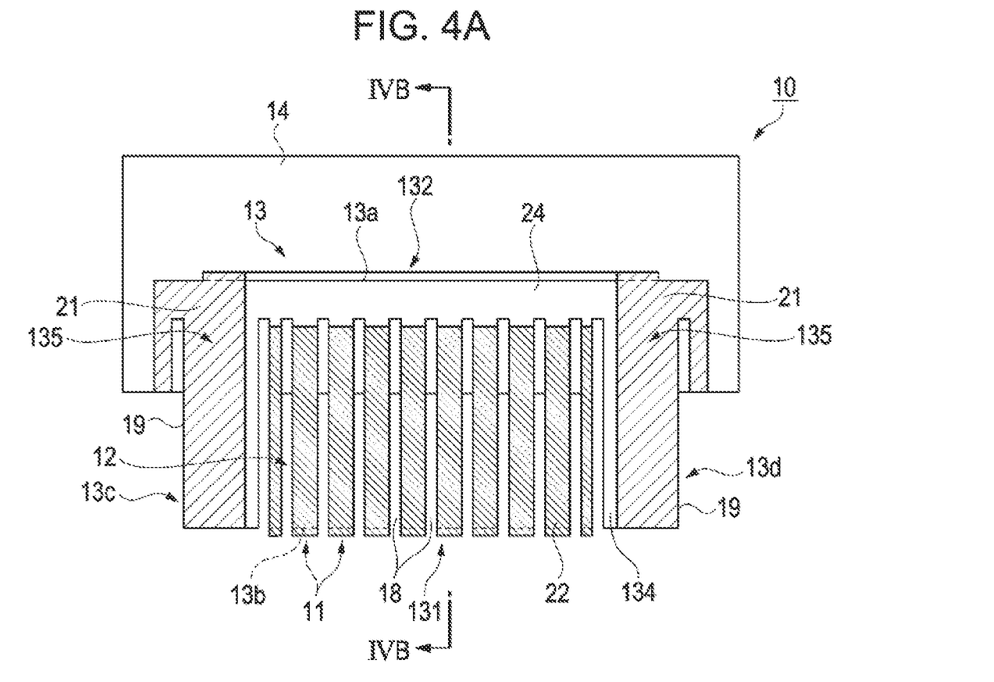
FIG. 4A is a schematic plan view of the piezoelectric unit according to the embodiment.
Figure 4B:
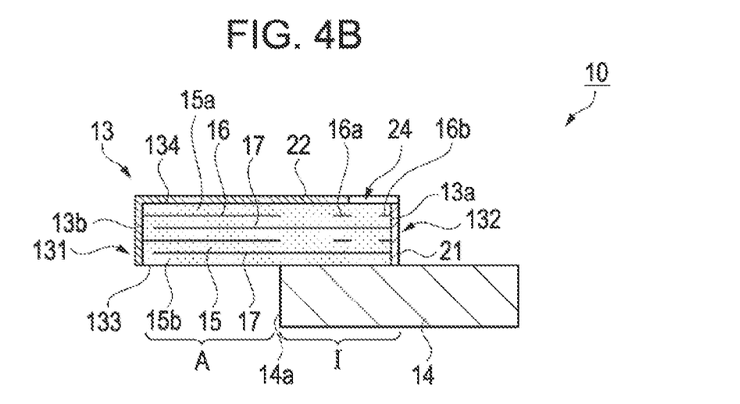
FIG. 4B is a schematic cross-sectional view taken along a line IVB-IVB in FIG. 4A.

FIG. 3 is a schematic perspective view of the piezoelectric unit 10 viewed from the side of the piezoelectric element 11. FIG. 4A is a schematic plan view thereof, and FIG. 4B is a schematic cross-sectional view taken along a line IVB-IVB in FIG. 4A. In these drawings, the circuit board 50 is not illustrated.

As shown in FIGS. 3, 4A and 4B, the piezoelectric unit 10 includes a piezoelectric element block 13 including a row 12 formed of the plurality of piezoelectric elements 11 aligned in the width direction thereof. The distal end portion 131 of the piezoelectric element block 13 constitutes a free end, and the fixing substrate 14 is connected to the opposite end portion, i.e. a base end portion 132.

Referring to FIGS. 2A and 4B, a part of the piezoelectric element block 13 is composed of a piezoelectric material layer 15, and internal electrodes constituting two poles of the piezoelectric element 11, namely an individual internal electrode 16, exemplifying the second internal electrode and constituting an individual electrode electrically independent from the adjacent piezoelectric element 11, and a common internal electrode 17, exemplifying the first internal electrode and constituting a common electrode electrically common with the adjacent piezoelectric element 11, the individual internal electrode 16 and the common internal electrode 17 being alternately stacked in the piezoelectric material layer 15.

It is preferable to employ a silver/palladium alloy to form the individual internal electrode 16 and the common internal electrode 17, because of the sintering shrinkage that agrees with that of the piezoelectric material layer 15, close adhesion therewith, and high reliability.

In addition, an upper outer layer 15a and a lower outer layer 15b, formed of an insulative piezoelectric material, are stacked so as to form outer layers.

The piezoelectric element block 13 may be formed, for example, by stacking a green sheet formed of a slurry containing a dielectric to constitute the piezoelectric material layer 15, the upper outer layer 15a, and the lower outer layer 15b, powder of a conductive material to form the individual internal electrode 16 and the common internal electrode 17, and a paste containing non-volatile organic components, and sintering the stacked structure. By the sintering, the volume of the green sheet and the paste is reduced.

Here, the number of layers shown in FIGS. 2A and 4B is only exemplary, and a different structure may be adopted.

A plurality of slits 18 are formed in the piezoelectric element block 13 with a wire saw for example, such that a portion thereof on the side of the distal end portion 131 is split in a comb teeth shape, and thus the row 12 of the piezoelectric elements 11 is formed.

When a voltage is applied between the individual internal electrode 16 and the common internal electrode 17 constituting the piezoelectric element 11, primarily an active region A, corresponding to the side of the distal end portion 131 not connected to the fixing substrate 14, is caused to vibrate. On the respective outer sides of the row 12 of the piezoelectric elements 11, positioning members 19 wider than the individual piezoelectric elements 11 are provided. The positioning members 19 serve for accurate positioning of the piezoelectric unit 10 with respect to the ink jet recording head 300 shown in FIG. 2, when the piezoelectric unit 10 is mounted thereon.

In each of the piezoelectric elements 11, the individual internal electrode 16 is formed so as to extend from the distal end portion 131 through the active region A, i.e., to the vicinity of a position corresponding to an end face 14a of the fixing substrate 14. In addition, a farthest dummy electrode 16b exemplifying the first dummy electrode, and a dummy electrode island 16a exemplifying the isolated second dummy electrode are provided along the extension from the individual internal electrode 16 toward the base end portion 132. The farthest dummy electrode 16b is located at the base end portion 132, and the dummy electrode island 16a is located between the individual internal electrode 16 and the farthest dummy electrode 16b.

On the other hand, the common internal electrode 17 serving as the common electrode is formed so as to extend through the active region A as far as the base end portion 132. The portion of the piezoelectric element 11 attached to the fixing substrate 14, where the individual internal electrode 16 is not located, constitutes an inactive region I that is barely involved in the vibration.

The common external electrode 21, connected to the common internal electrode 17, is provided on a surface of one side of the piezoelectric element block 13 (in this embodiment, surface 134 opposite a surface 133 attached to the fixing substrate 14), as well as on an end face 13*a* of the base end portion 132. The connection between the common internal electrode 17 and the common external electrode 21 is made at the end face 13*a* of the base end portion 132.

On the surface 134 and an end face 13*b* of the distal end portion 131, the individual external electrode 22 is provided which is split so as to correspond to each piezoelectric element 11 such that each split segment becomes electrically independent, and connected to the individual internal electrode 16.

The common external electrode 21 and the individual external electrode 22 are formed so as to reach the surface 134 of the inactive region I, and the driver wiring 51 is connected to the common external electrode 21 and the individual external electrode 22 located in the inactive region I.

The common external electrode 21 and the individual external electrode 22 will be described in further details here below. The common external electrode 21 is continuously provided over a region including the respective corner portions 135 on the side of the base end portion 132 of the surface 134 of the piezoelectric element block 13 and the end face 13*a* of the base end portion 132.

On the other hand, the individual external electrode 22 is continuously provided over a region including the end face 13*b* of the distal end portion 131 and the surface 134 of the piezoelectric element block 13. On the surface 134, the individual external electrode 22 extends in the direction in which the slits 18 are formed, so as to overlap a part of a region between the portions of the common external electrode 21 located in the vicinity of the respective corner portions 135 on the surface 134 of the piezoelectric element block 13.

In addition, a region on the surface 134 between the base end portion 132 and the individual external electrode 22 is constituted as a region without electrode 24 where the individual external electrode 22 is not located.

Referring again to FIGS. 1, 2A and 2B, in the ink jet recording head 300 thus configured, the ink is supplied to the reservoir 63 through the ink supply path communicating with the black ink cartridge 106 and the color ink cartridge 107, and distributed to the respective pressure chambers 62 through the ink outlet 64.

More specifically, upon applying a voltage to the piezoelectric unit 10 the piezoelectric unit 10 is made to contract. Accordingly the vibration plate 65 is lifted together with the piezoelectric unit 10, and the volume of the pressure chamber 62 is expanded so that the ink is introduced into the pressure chamber 62. After the pressure chambers 62 are filled with the ink so as to reach the nozzle opening 66, when the piezoelectric unit 10 is released from the voltage thus far applied thereto in accordance with a recording signal from the driver circuit, the piezoelectric unit 10 is prolonged so as to resume the initial state. Therefore, the vibration plate 65 is also displaced so as to resume the initial state and the pressure chamber 62 is made to contract, so that the ink droplet is dispensed through the nozzle opening 66 because of the increase in internal pressure.

The foregoing embodiment offers the following advantageous effects.

(1) In the inactive region I, the farthest dummy electrode 16*b* formed in the base end portion 132 and the isolated dummy electrode island 16*a* are located at the positions extended from the individual internal electrode 16 toward the base end portion 132. Such a configuration allows the area of the dummy electrode to be reduced, compared with the dummy electrode continuously formed in the inactive region I. Therefore, the cost incurred by the dummy electrode is reduced, which leads to reduction in manufacturing cost of the piezoelectric unit 10.

In addition, at least one isolated dummy electrode island 16*a* is provided in the inactive region I between the individual internal electrode 16 and the farthest dummy electrode 16*b*. Accordingly, the portion of the inactive region I where the dummy electrode island 16*a* and the farthest dummy electrode 16*b* are provided can maintain the same thickness as that of the active region A, unlike in the case where the isolated dummy electrode island 16*a* is not provided, and hence fluctuation in thickness of the piezoelectric element block 13 in the inactive region I can be suppressed. Such a configuration allows the individual external electrode 22 and the common external electrode 21, extending to the surface 134 of the inactive region I, to remain generally flat. In the piezoelectric unit 10, therefore, the driver wiring 51 provided on the one side of the circuit board 50 can be connected along a flat surface to the common external electrode 21 and the individual external electrode 22.

(2) Consumption of palladium which is a rare metal can be reduced, which leads to further reduction in manufacturing cost of the piezoelectric unit 10.

(3) Since the individual external electrode 22 and the common external electrode 21 are generally flatly formed, the electrode pad 26 uniformly collapses when a pressure is imposed thereon for achieving the connection. Accordingly, contacts among the metal particles in the electrode pad 26 can be secured, which allows the piezoelectric unit 10 to provide assured connection between the driver wiring 51 formed on the one surface of the circuit board 50, and the individual external electrode 22 and the common external electrode 21.

(4) The common internal electrode 17 extends from the active region A to the base end portion 132 of the piezoelectric element block 13 and is connected to the common external electrode 21 at the end face 13*a* of the base end portion 132. With such a configuration, the piezoelectric unit 10 facilitates the formation of the common electrode. On the other hand, the individual internal electrode 16 extends through the active region A to the distal end portion 131 of the piezoelectric element block 13, and is connected to the individual external electrode 22 at the end face 13*b* of the distal end portion 131 of the piezoelectric elements 11 formed along the slits 18 extending from the distal end portion 131 toward the base end portion 132 of the piezoelectric element block 13. With such a configuration, the piezoelectric unit 10 facilitates the formation of the individual electrode.

(5) In addition to the foregoing advantageous effects, since the thickness of the inactive region I of the piezoelectric element block 13 is maintained generally uniform and the surface thereof is generally flat, the inactive region I can be coupled with the flat fixing substrate 14 with high positioning accuracy and therefore the distal end portion 131 of the piezoelectric element 11 is barely shifted from the desired contact position on the vibration plate 65. Consequently, the extension and contraction of the piezoelectric element 11 can be efficiently transmitted to the vibration plate 65, which enables the liquid ejecting head 300 to accurately eject a predetermined amount of liquid.

(6) The liquid ejecting apparatus 100 equally provides the foregoing advantageous effects.

The foregoing embodiment will be described more specifically, referring to an inventive example, comparative examples 1 and 2, and a conventional example.

Inventive Example

Figure 5:
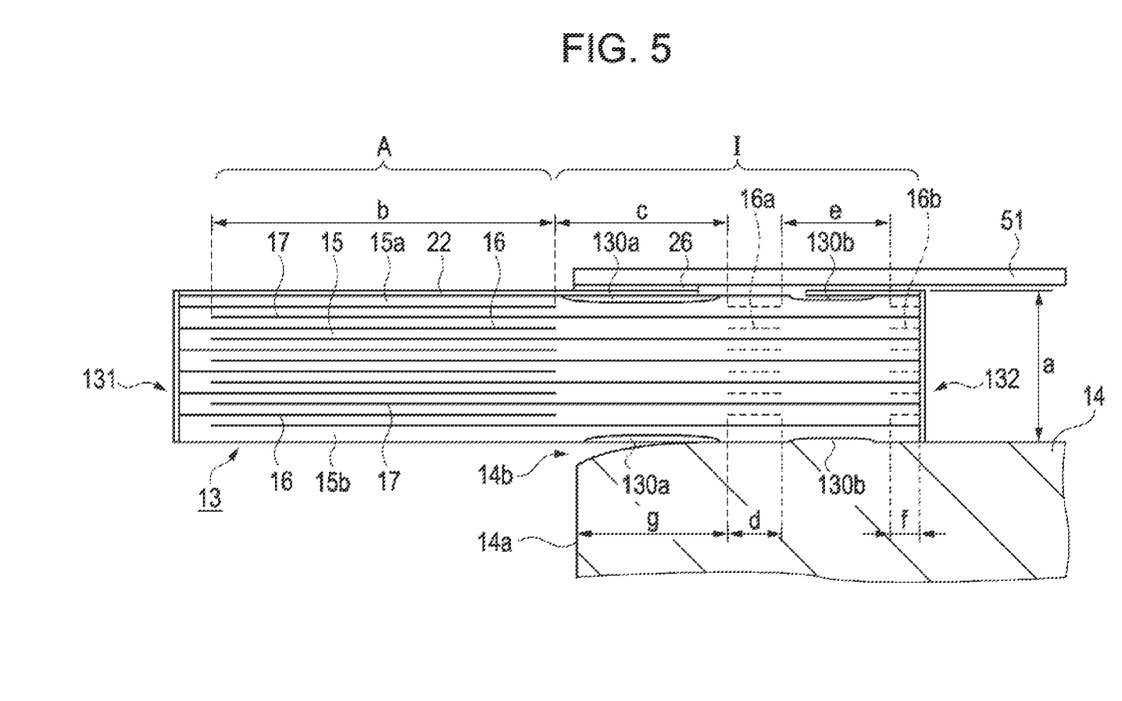
FIG. 5 is a cross-sectional view of the piezoelectric unit according to an inventive example, corresponding to the cross-sectional view taken along the line IVB-IVB in FIG. 4A.

FIG. 5 illustrates further details of the cross-sectional view taken along the line IVB-IVB in FIG. 4A. The piezoelectric material layer 15 is composed of 13 layers including the upper outer layer 15a and the lower outer layer 15b, in other words the piezoelectric material layer 15 interposed between the individual internal electrode 16 and the common internal electrode 17 is composed of 11 layers.

Now, the thickness of the piezoelectric element block 13 will be denoted as a, the length of the active region A will be denoted as b, the distance between the individual internal electrode 16 and the dummy electrode island 16a will be denoted as c, the length of the dummy electrode island 16a will be denoted as d, the distance between the dummy electrode island 16a and the farthest dummy electrode 16b will be denoted as e, the length of the farthest dummy electrode 16b will be denoted as f, and the distance in the longitudinal direction between the end face 14a of the fixing substrate 14 and the dummy electrode island 16a will be denoted as g. All above indicate the distance or length along the direction from the base end portion 132 toward the distal end portion 131, except for the thickness.

In the inventive example, the foregoing dimensions were set as a=0.28 mm, b=1.20 mm, c=0.62 mm, d=0.20 mm, e=0.35 mm, f=0.13 mm, and g=0.55 mm. Here, d may be 0.10 mm and e may be 0.45 mm.

Figure 6:
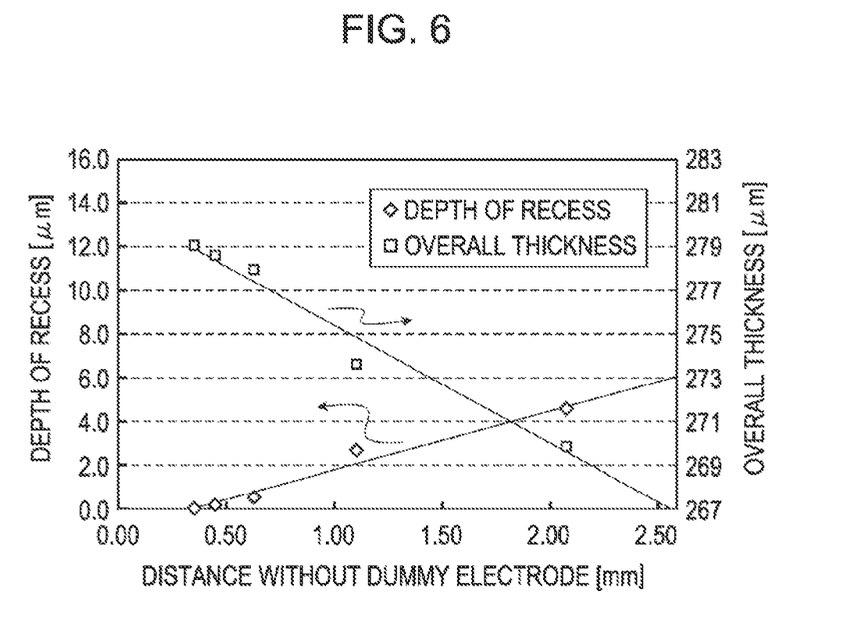
FIG. 6 is a graph showing a relationship between a distance in which a dummy electrode is not located and a depth of a recess and an overall thickness at the position where the dummy electrode is not located.

FIG. 6 is a graph in which the horizontal axis represents the distance c between the individual internal electrode 16 and the dummy electrode island 16a or the distance e between the dummy electrode island 16a and the farthest dummy electrode 16b (distance through which the dummy electrode is not present), and the vertical axis represents the depth of recesses 130a, 130b, and 130c and the overall thickness of the portion where the dummy electrode is not present, with respect to the inventive example, the comparative examples 1 and 2, and the conventional example.

As stated above, the inventive example corresponds to 0.62 mm, 0.45 mm, and 0.35 mm of the horizontal axis.

The recesses 130a, 130b, and 130c are formed because the extent of contraction differs by positions depending on whether the paste for forming the dummy electrode is provided.

When the distance without the dummy electrode increases, the recess becomes deeper and hence the overall thickness decreases. The depth of the recess and the overall thickness are generally linearly proportional to the distance without the dummy electrode.

In the inventive example, the depths of the recess corresponding to c=0.62 mm, e=0.45 mm, and e=0.35 mm were 0.5 μm, 0.2 μm, and 0.0 μm, respectively.

With the depth of 0.5 μm or less, no problem arose in the connection between the circuit board 50 and the common external electrode 21 and the individual external electrode 22.

In addition, the inventive example had two portions where the overall thickness a was secured (corresponding to the dummy electrode island 16a and the farthest dummy electrode 16b), which could be placed on a region outside of a sag portion 14b on the flat fixing substrate 14, when the piezoelectric element block 13 was fixed. Therefore, the relative position between the inactive region I and the flat fixing substrate 14 was barely shifted.

The sag portion 14b is prone to be formed on an end portion of the fixing substrate 14, in the case where the fixing substrate 14 is formed by punching a stainless steel plate. It is preferable to locate the dummy electrode island 16a at a position deviated from the sag portion 14b. For example, in the case where the sag portion 14b is formed in a maximum width of 0.5 mm from the edge, it is preferable to set the distance g between the end face 14a of the fixing substrate 14 and the dummy electrode island 16a as approximately 0.55 mm.

Comparative Example 1

Figure 7:
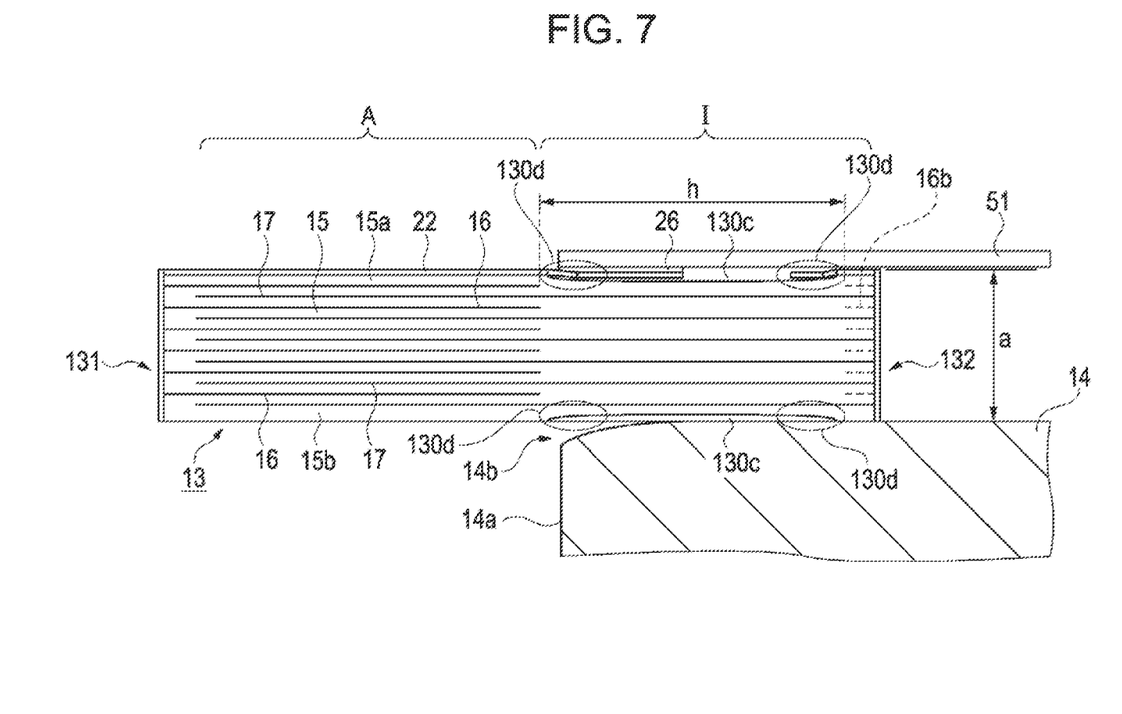
FIG. 7 is a cross-sectional view of a piezoelectric unit according to comparative examples 1 and 2, corresponding to the cross-sectional view taken along the line IVB-IVB in FIG. 4A.

FIG. 7 is a cross-sectional view of the comparative example 1.

The comparative example 1 is different from the inventive example in not including the dummy electrode island 16a. The distance h between the individual internal electrode 16 and the farthest dummy electrode 16b was set as 1.10 mm. The structure and dimensions of the remaining portions were the same as those of the embodiment.

The depth of the recess was 2.7 μm corresponding to h=1.10 mm in FIG. 6, and a sloped portion 130d was formed along the periphery of the recess 130c. Because of the sloped portion 130d, the portion of the individual external electrode 22 in the inactive region I could not be kept flat and therefore the contact between the circuit board 50 and the individual external electrode 22 was imperfect.

In addition, the comparative example 1 had only one position where the overall thickness a was secured (corresponding to the position where the farthest dummy electrode 16b is located) in a region outside of the sag portion 14b of the flat fixing substrate 14, and therefore the piezoelectric element block 13 was fixed with an inclination, and the positioning between the inactive region I and the flat fixing substrate 14 was remarkably shifted.

Comparative Example 2

The comparative example 2 is different from the comparative example 1 only in that the distance h between the individual internal electrode 16 and the farthest dummy electrode 16b is 2.09 mm.

The depth of the recess was 4.6 μm corresponding to h=2.09 mm in FIG. 6, and a large sloped portion 130d was formed along the periphery of the recess 130c. Because of the sloped portion 130d, the portion of the individual external electrode 22 in the inactive region I could not be kept flat and therefore the contact between the circuit board 50 and the individual external electrode 22 was imperfect, as with the comparative example 1.

Conventional Example

Figure 8:
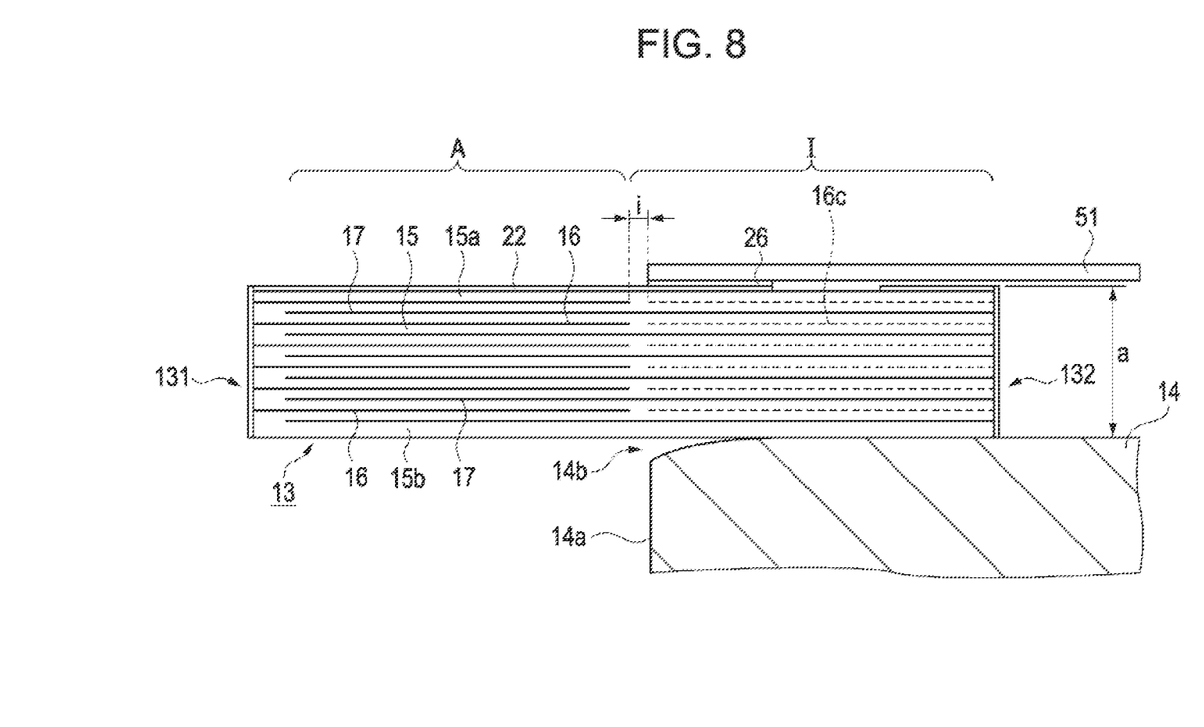
FIG. 8 is a cross-sectional view of a piezoelectric unit according to a conventional example, corresponding to the cross-sectional view taken along the line IVB-IVB in FIG. 4A.

FIG. 8 is a cross-sectional view of the conventional example, corresponding to the cross-sectional view taken along the line IVB-IVB in FIG. 4A. In the conventional example, neither the dummy electrode island 16a nor the farthest dummy electrode 16b was formed unlike in the inventive example, and a dummy electrode 16c is formed from the base end portion 132 to the vicinity of the individual internal electrode 16. The dummy electrode 16c is spaced from the individual internal electrode 16 by a distance i, which is 0.15 mm for example. The recess is barely formed in the conventional example.

[Variation]

Figure 9:
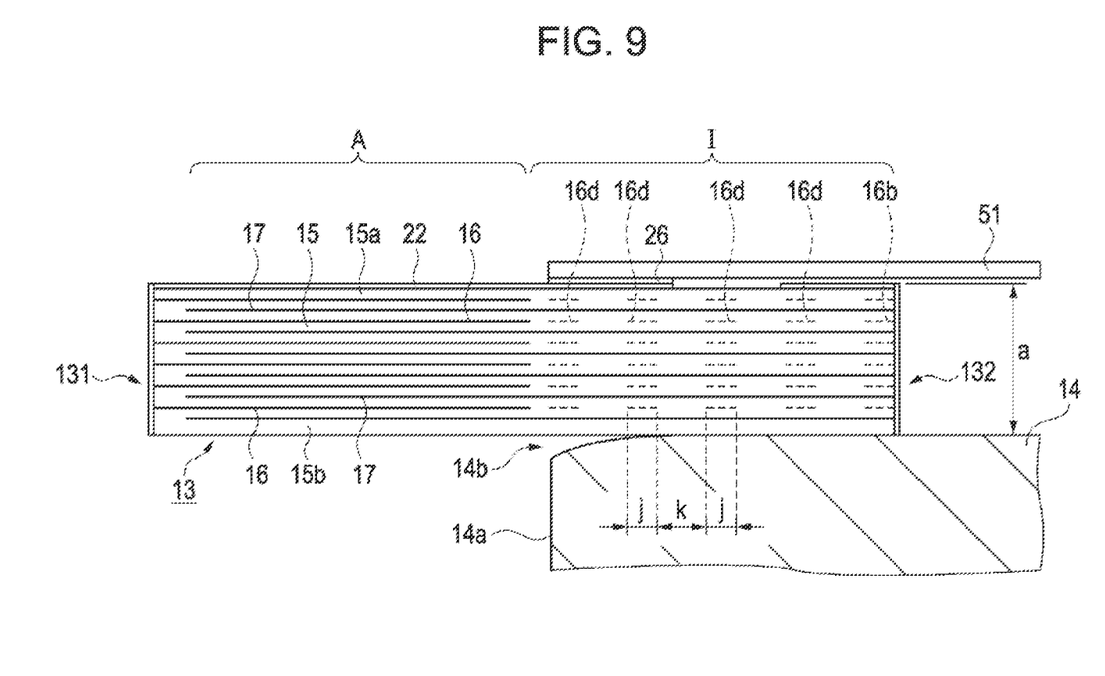
FIG. 9 is a cross-sectional view of a piezoelectric unit according to a variation, corresponding to the cross-sectional view taken along the line IVB-IVB in FIG. 4A.

FIG. 9 is a cross-sectional view of a variation, corresponding to the cross-sectional view taken along the line IVB-IVB in FIG. 4A. In the variation, the dummy electrode islands 16*d* are provided at four positions. Although it is preferable to shorten the length j of the dummy electrode island 16*d* from the viewpoint of the cost, the limit of the length depends, for example, on a minimum printable length. In the case where the minimum printable length is 0.1 mm, the lower limit of the length of the dummy electrode island 16*d* is 0.1 mm. To determine the distance k between the dummy electrode islands 16*d*, a point corresponding to the depth of recess of 0.5 μm or less may be selected in the graph of FIG. 6, in other words a distance without dummy electrode of 0.62 mm or less may be selected.

Here, the number of dummy electrode islands 16*d* is not limited to four, but may be any desired number.

Various modifications may be made to the foregoing embodiment.

For example, the configuration of the common external electrode 21 and the individual external electrode 22 provided on the surface 134 of the piezoelectric element block 13 is not limited to the foregoing embodiment.

Although the slits 18 are formed so as not to reach the end face 13*a* of the piezoelectric element block 13 in the embodiment, the slits 18 may be formed so as to reach the end face 13*a* of the piezoelectric element block 13. On the end face 13*a* of the piezoelectric element block 13, the common external electrode 21 is provided except in the region close to the end portion on the respective sides. Accordingly, even though a part of the common internal electrode 17 stacked in the piezoelectric element 11 is completely split into segments in each of the piezoelectric element 11 because of forming the slits 18 so as to reach the end face 13*a* of the piezoelectric element block 13, electrical connection between each of the split segments of the common internal electrode 17 can be secured by the common external electrode 21 provided on the end face 13*a*.

In the embodiment, the individual external electrode 22 is formed over a region slightly larger than the region corresponding to the row 12 of the piezoelectric elements 11, so that the individual external electrode 22 is also provided on a part of the positioning member 19. By thus forming the individual external electrode 22 integrally over a distance longer than the length of the row 12 of the piezoelectric elements 11, the individual external electrode 22 can be surely provided on each of the piezoelectric elements 11 when split by the slits 18, even though the slits 18 are formed at slightly deviated positions.

Further, although the region without electrode 24 is provided throughout the region on the surface 134 of the piezoelectric element block 13 between the base end portion 132 and the individual external electrode 22 in the embodiment, an electrode layer may be provided along the base end portion 132, so that the common external electrode 21 is continuously provided so as to cover the surface 134 of the piezoelectric element block 13.

Further, although the common external electrode 21 is connected to the common internal electrode 17 at the end face 13*a* of the base end portion 132 of the piezoelectric element block 13 in the embodiment, different configurations may be adopted. For example, the common external electrode 21 may be formed on the respective side faces of the piezoelectric element block 13 in the width direction, namely side faces 13*c*, 13*d* thereof, so as to be connected to the common internal electrode 17 at the side faces 13*c*, 13*d* of the piezoelectric element block 13. Alternatively, the common external electrode 21 may be continuously formed over a region including the side faces 13*c*, 13*d* of the piezoelectric element block 13 and the end face 13*a* thereof.

What is claimed is:

1. A piezoelectric unit, comprising:
   a piezoelectric element including an active region;
   a piezoelectric element block including an inactive region and the piezoelectric element so as to extend along a direction from a first end portion of the piezoelectric element block toward a second end portion of the piezoelectric block;
   wherein the active region is provided with a first internal electrode, a second internal electrode and a piezoelectric material layer interposed between the first internal electrode and the second internal electrode, the second internal electrode being connected to a second external electrode,
   wherein the inactive region is provided with the first internal electrode extending from the active region as far as the second end portion, a first dummy electrode formed on the second end portion at a position along an extension from the second internal electrode toward the second end portion, at least one isolated second dummy electrode formed between the second internal electrode and the first dummy electrode and the piezoelectric material layer, the first internal electrode and the first dummy electrode being connected to a first external electrode,
   wherein the isolated second dummy electrode is formed at an extended position from an end of the second internal electrode with only piezoelectric material disposed therebetween, a distance between the end of the second internal electrode and the isolated second dummy electrode being greater than a distance between the first dummy electrode and the isolated second dummy electrode.

2. The piezoelectric unit according to claim 1, wherein the first internal electrode and the second internal electrode contain a silver/palladium alloy.

3. The piezoelectric unit according to claim 1, wherein the first internal electrode serves as a common internal electrode of the piezoelectric element, and the second internal electrode serves as an individual internal electrode of the piezoelectric element.

4. A liquid ejecting head, comprising:
   a nozzle plate including nozzle openings;
   a flow path plate including a part of a pressure chamber communicating with the nozzle opening;
   a vibration plate constituting a part of the pressure chamber;
   a circuit board with a driving electrode formed on a surface; and
   wherein the piezoelectric unit according to claim 1 is set to the vibration plate.

5. A liquid ejecting apparatus, comprising the liquid ejecting head according to claim 4.

6. A piezoelectric unit comprising:
   a piezoelectric block element that includes an active region and an inactive region;
   a fixing substrate, wherein the inactive region of the piezoelectric block element is attached to the fixing substrate and wherein the active region extends away from the fixing substrate;
   wherein the active region includes:

a first internal electrode;
a second internal electrode; and
a piezoelectric material interposed between the first internal electrode and the second internal electrode;
wherein the inactive region includes:
the first internal electrode; and
at least one dummy electrode, wherein the piezoelectric material is interposed between the first internal electrode and the at least one dummy electrode, wherein the at least one dummy electrode is positioned at an extended position from an end of the second internal electrode with only piezoelectric material disposed therebetween, a distance between the end of the second internal electrode and the at least one dummy electrode being greater than a distance between an end of the inactive region spaced apart from the end of the second internal electrode and the at least one dummy electrode;

wherein the first internal electrode is connected to a first external electrode disposed on an outside surface of the piezoelectric block element;
wherein the second internal electrode is connected to a second external electrode disposed on a surface of the piezoelectric block element.

7. The piezoelectric unit of claim 6, wherein the at least one dummy electrode includes a first dummy electrode formed as an island in the piezoelectric material and a second dummy electrode connected with the first external electrode.

8. The piezoelectric unit of claim 6, wherein the at least one dummy electrode is arranged in line with the second internal electrode.

9. The piezoelectric unit of claim 6, wherein the at least one dummy electrode is formed such that a thickness of the active region is similar to a thickness of the inactive region.

* * * * *